United States Patent
Park et al.

(10) Patent No.: US 8,637,399 B2
(45) Date of Patent: Jan. 28, 2014

(54) ETCHING COMPOSITION, METHOD OF FORMING A METAL PATTERN AND METHOD OF MANUFACTURING A DISPLAY SUBSTRATE

(75) Inventors: Hong-Sick Park, Suwon-si (KR); Bong-Kyun Kim, Hwaseong-si (KR); Wang-Woo Lee, Suwon-si (KR); Ki-Beom Lee, Seoul (KR); Sam-Young Cho, Anyang-si (KR); Won-Guk Seo, Suwon-si (KR); Gyu-Po Kim, Hwaseong-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/600,392

(22) Filed: Aug. 31, 2012

(65) Prior Publication Data
US 2013/0115770 A1  May 9, 2013

(30) Foreign Application Priority Data
Nov. 9, 2011  (KR) .................. 10-2011-0116469

(51) Int. Cl.
*H01L 21/311* (2006.01)

(52) U.S. Cl.
USPC 438/669; 438/73; 257/E21.214; 257/E33.053

(58) Field of Classification Search
USPC .............. 438/669, 73; 257/E21.214, E33.053
See application file for complete search history.

(56) References Cited

U.S. PATENT DOCUMENTS

| | | | |
|---|---|---|---|
| 2007/0004049 A1* | 1/2007 | Nasu et al. .................... | 438/3 |
| 2008/0224092 A1* | 9/2008 | Choung et al. ............... | 252/79.3 |
| 2010/0291722 A1* | 11/2010 | Kim et al. ..................... | 438/38 |
| 2012/0153287 A1* | 6/2012 | Park et al. ..................... | 257/59 |
| 2012/0295380 A1* | 11/2012 | Kim et al. ..................... | 438/34 |
| 2013/0115727 A1* | 5/2013 | Park et al. ..................... | 438/34 |
| 2013/0115733 A1* | 5/2013 | Kim et al. ..................... | 438/104 |
| 2013/0178010 A1* | 7/2013 | Kim et al. ..................... | 438/73 |

* cited by examiner

*Primary Examiner* — N Drew Richards
*Assistant Examiner* — Ankush Singal
(74) *Attorney, Agent, or Firm* — F. Chau & Associates, LLC (57) ABSTRACT

An etching composition for a copper-containing layer includes about 0.1% to about 30% by weight of ammonium persulfate, about 0.1% to about 10% by weight of a sulfate, about 0.01% to about 5% by weight of an acetate and about 55% to about 99.79% by weight of water. The etching composition having improved stability during storage and an increased capacity for etching.

15 Claims, 7 Drawing Sheets

| | |
|---|---|
| SAMPLE 1 |  |
| SAMPLE 2 |  |
| SAMPLE 3 |  |
| SAMPLE 4 |  |
| SAMPLE 5 |  |
| SAMPLE 6 |  |
| SAMPLE 7 |  |
| SAMPLE 8 |  |
| COMPARATIVE SAMPLE 1 |  |
| COMPARATIVE SAMPLE 2 |  |
| COMPARATIVE SAMPLE 3 |  |
| COMPARATIVE SAMPLE 4 |  |

FIG. 6

| DAYS | |
|---|---|
| 0 |  |
| 3 |  |
| 6 |  |
| 9 |  |
| 12 |  |
| 15 |  |

ETCHING COMPOSITION, METHOD OF FORMING A METAL PATTERN AND METHOD OF MANUFACTURING A DISPLAY SUBSTRATE

RELATED APPLICATIONS

This application claims priority under 35 U.S.C. §119 to Korean Patent Application No. 10-2011-0116469, filed on Nov. 9, 2011 in the Korean Intellectual Property Office (KIPO), the contents of which are herein incorporated by reference in their entirety.

BACKGROUND

1. Technical Field

Example embodiments of the present invention relate to an etching composition, a method of forming a metal pattern and a method of manufacturing a display substrate. More particularly, example embodiments of the present invention relate to an etching composition for etching a metal layer including copper, a method of forming a metal pattern and a method of manufacturing a display substrate.

2. Description of the Related Art

As the size of a display device and the requirements of a customer for a high resolution are increased, the length of the gate line or the data line is increased and the width of the gate line or the data line is decreased so that the electrical resistance is increased. This increase in electrical resistance causes a resistance-capacitance ("RC") signal delay. The gate line or the data line can be formed from a metal having a relatively low resistance to reduce the RC signal delay.

Copper as a metal having a relatively low resistance and used for forming the gate line or the data line has excellent electric conductivity and is a plentiful natural resource. In addition, copper has a resistance much lower than aluminum or chromium. In contrast, a resistance of copper against an oxidizer is higher than that of aluminum or chromium, so that a strong oxidizer may be used for etching a copper layer.

Korean Patent Publication No. 2000-79355 discloses an etching composition for a copper layer, which includes hydrogen peroxide, an inorganic acid and a neutral salt, and Korean Patent Publication No. 2005-00682 discloses an etching composition for a copper layer, which includes hydrogen peroxide, a copper-reaction inhibitor, a hydrogen peroxide stabilizer and a fluoric ion, and Korean Patent Publication No. 2006-64881 discloses an etching composition for a copper layer, which further includes five additives including a fluorine-containing compound, an organic compound further to hydrogen peroxide, Korean Patent Publication No. 2000-32999 discloses an etching composition for a copper layer, which includes iron chloride (III) hexahydrate and hydrofluoric acid.

When the conventional etching compositions are used for etching a copper layer, an etching ratio to a copper layer or a neighboring metal layer may be excessively great, or an obtained pattern may have an inversed taper shape, which has a taper angle more than 90°. Furthermore, hydrogen peroxide decomposes into water and oxygen through disproportionation in the presence of a copper ion and an iron ion so that heat is generated and its composition rapidly changes. Thus, the manufacturing margin and the storing stability of the etching composition may be reduced. However, addition of a hydrogen peroxide stabilizer may result in increased manufacturing costs.

Furthermore, when the conventional etching compositions are used for etching a copper alloy layer, a taper angle of an obtained pattern may be excessively small, for example, lower than 20° since etching ratios to metals included in the copper alloy layer are different from each other. Thus, substantial etching failures may result. Furthermore, when a taper angle of an obtained pattern is excessively small, the width of the line is substantially reduced so that electrical resistance is increased.

SUMMARY

Example embodiments of the present invention provide an etching composition capable of improving manufacturing margin and storing stability.

Example embodiments of the present invention also provide a method of forming a metal pattern having a stable taper shape using the above-mentioned etching composition.

Example embodiments of the present invention also provide a method of manufacturing a display substrate using the above-mentioned etching composition.

According to an example embodiment of the present invention, an etching composition includes about 0.1% to about 30% by weight of ammonium persulfate, about 0.1% to about 10% by weight of a sulfate, about 0.01% to about 5% by weight of an acetate and about 55% to about 99.79% by weight of water.

In an example embodiment, the sulfate includes one or more sulfates selected from the group consisting of ammonium sulfate, sodium sulfate, potassium sulfate, calcium sulfate, copper sulfate, magnesium sulfate, zinc sulfate, iron sulfate, aluminum sulfate and barium sulfate.

In an example embodiment, the acetate includes one or more sulfates selected from the group consisting of ammonium acetate, sodium acetate, potassium acetate, calcium acetate, aluminum acetate, zinc acetate, tin acetate and magnesium acetate.

In an example embodiment, the copper-containing layer includes a copper layer and/or a copper-manganese alloy layer.

In an example embodiment, the etching composition includes about 5% to about 15% by weight of ammonium persulfate, about 0.5% to about 5% by weight of the sulfate, about 0.1% to about 3% by weight of the acetate, and about 77% to about 94.4% by weight of water.

According to an example embodiment of the present invention, a method of forming a metal pattern is provided. In the method, a metal layer including a copper-manganese alloy layer is formed on a base substrate. A photoresist pattern is formed on the metal layer. The metal layer is etched by using an etching composition including about 0.1% to about 30% by weight of ammonium persulfate, about 0.1% to about 10% by weight of a sulfate, about 0.01% to about 5% by weight of an acetate and about 55% to about 99.79% by weight of water.

In an example embodiment, the sulfate includes one or more sulfates selected from the group consisting of ammonium sulfate, sodium sulfate, potassium sulfate, calcium sulfate, copper sulfate, magnesium sulfate, zinc sulfate, iron sulfate, aluminum sulfate and barium sulfate.

In an example embodiment, the acetate includes one or more sulfates selected from the group consisting of ammonium acetate, sodium acetate, potassium acetate, calcium acetate, aluminum acetate, zinc acetate, tin acetate and magnesium acetate.

In an example embodiment, the metal layer further includes a copper layer formed under the copper-containing layer.

In an example embodiment, the metal layer further includes a titanium layer formed under the copper layer. The titanium layer is patterned by a titanium etching composition different from the etching composition.

According to an example embodiment of the present invention, a method of manufacturing a display substrate is provided. In the method, a first metal layer is formed on a base substrate. The first metal layer is patterned by using a photoresist pattern formed on the first metal layer as an etch-stop layer and by using an etching composition including about 0.1% to about 30% by weight of ammonium persulfate, about 0.1% to about 10% by weight of a sulfate, about 0.01% to about 5% by weight of an acetate and about 55% to about 99.79% by weight of water form a first signal line, a source electrode connected to the first signal line and a drain electrode spaced apart from the source electrode.

In an example embodiment, the sulfate includes one or more sulfates selected from the group consisting of ammonium sulfate, sodium sulfate, potassium sulfate, calcium sulfate, copper sulfate, magnesium sulfate, zinc sulfate, iron sulfate, aluminum sulfate and barium sulfate.

In an example embodiment, the acetate includes one or more sulfates selected from the group consisting of ammonium acetate, sodium acetate, potassium acetate, calcium acetate, aluminum acetate, zinc acetate, tin acetate and magnesium acetate.

In an example embodiment, the first metal layer includes a copper-manganese alloy layer. A passivation layer is formed on the base substrate having the drain electrode, the passivation layer covering the first signal line, the source electrode and the drain electrode, and including silicon oxide.

In an example embodiment, the first metal layer further includes a copper layer formed under the copper-manganese alloy layer.

In an example embodiment, the first metal layer further includes a titanium layer formed under the copper layer. The titanium layer is etched by using a titanium etching composition after the copper layer and the copper-manganese alloy layer are etched by using the etching composition. An insulation layer including silicon oxide is further formed under the titanium layer.

In an example embodiment, a semiconductor layer is formed under the first metal layer. The photoresist pattern has a first portion and a second portion thinner than the first portion. The first metal layer is etched by using the photoresist pattern as an etch-stop layer to form the first signal line and an electrode pattern connected to the first signal line. The semiconductor layer is patterned by using the photoresist pattern and the electrode pattern as an etch-stop layer to form an active pattern. The electrode pattern is patterned by using an remaining photoresist pattern formed by removing the second portion to expose the active pattern through a gap between the source electrode and the drain electrode.

In an example embodiment, a passivation layer is formed on the base substrate having the drain electrode, the passivation layer covering the first signal line, the source electrode and the drain electrode, and including silicon oxide. The semiconductor layer includes a metal oxide.

In an example embodiment, a second metal layer including a copper-containing metal layer is patterned by using an etching composition substantially same as the etching composition used for etching the first metal layer to form a second signal line crossing the first signal line, and a gate electrode connected to the second signal line.

The etching compositions according to the example embodiments of the present invention, have an improved storing stability, and an improved manufacturing margin. Thus, the etching composition may form a metal pattern having a profile of a stable tapered shape, even if the metal pattern includes a copper-manganese alloy layer. Furthermore, the etching composition may be stored without deterioration of etching characteristics. Thus, manufacturing reliability and productivity for a display substrate may be improved.

BRIEF DESCRIPTION OF THE DRAWINGS

The above and other features of the present invention will become more apparent by describing in detailed example embodiments thereof with reference to the accompanying drawings, in which.

DETAILED DESCRIPTION

Hereinafter, example embodiments of the present invention will be explained in detail with reference to the accompanying drawings.

FIGS. 1 to 4 are cross-sectional views illustrating a method of forming a metal pattern according to an example embodiment of the present invention.

Figure 1:
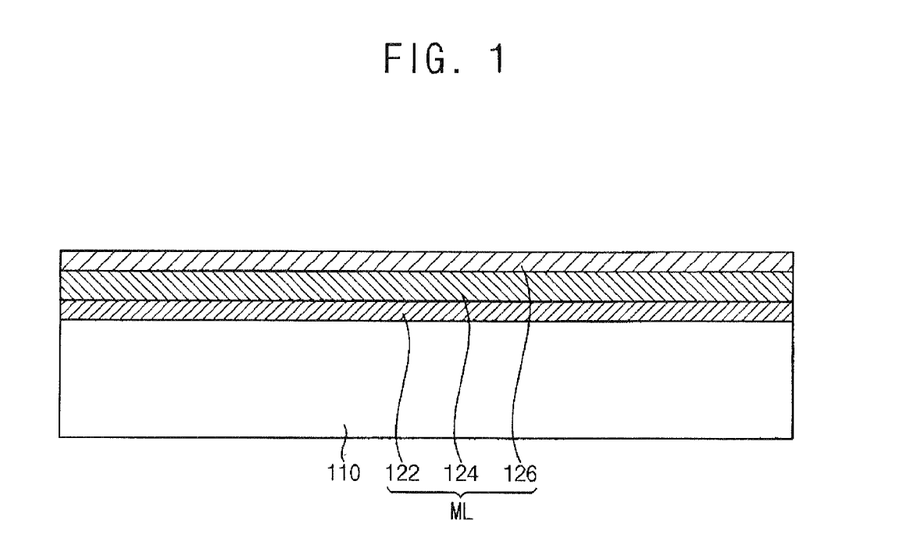
FIGS. 1 to 4 are cross-sectional views illustrating a method of forming a metal pattern according to an example embodiment of the present invention.

Referring to FIG. 1, a metal layer ML including a copper layer 124 and a copper-manganese alloy layer 126 is formed on a base substrate 110. The base substrate 110 may be a glass substrate including silicon oxide. The copper layer 124 and the copper-manganese alloy layer 126 may be sequentially deposited on the base substrate 110 through a chemical vaporization deposition (CVD) process.

The metal layer ML may further includes a titanium layer 122 disposed between the copper layer 124 and the base substrate 110. The titanium layer 122 may be formed through a CVD process. The titanium layer 122 may function as a buffer layer preventing copper of the copper layer 124 from diffusing into a neighboring pattern, for example, a metal oxide semiconductor, to prevent damage to the neighboring pattern. The thickness of the titanium layer 122 may be from about 100 Å to about 300 Å. Furthermore, when a pattern or a thin film, which includes silicon oxide, is formed between the titanium layer 122 and the base substrate 110, the titanium layer 122 may inhibit a chemical reaction between the copper layer 124 and the pattern or the thin film. Even though not illustrated, a plurality of patterns may be formed under the titanium layer 122.

The copper layer 124 may be formed on the titanium layer 122, and may have a thickness of from about 1,000 Å to about 5,000 Å. When a signal is applied through a metal pattern MP formed from the metal layer ML, the copper layer 124 may function as a main line layer substantially performing to transfer the signal. The copper layer 124 may be a substantial pure copper layer, which has much less impurities than copper.

The copper-manganese alloy layer 126 may be formed on the copper layer 124, and may have a thickness of from about 100 Å to about 300 Å. The copper-manganese alloy layer 126 includes copper and manganese. An atom ratio of copper to manganese of the copper-manganese alloy layer 126 may be about 1:1. The copper-manganese alloy layer 126 prevents the copper layer 124 from contacting a pattern including silicon oxide. Thus, damage to the copper layer may be prevented.

Figure 2:
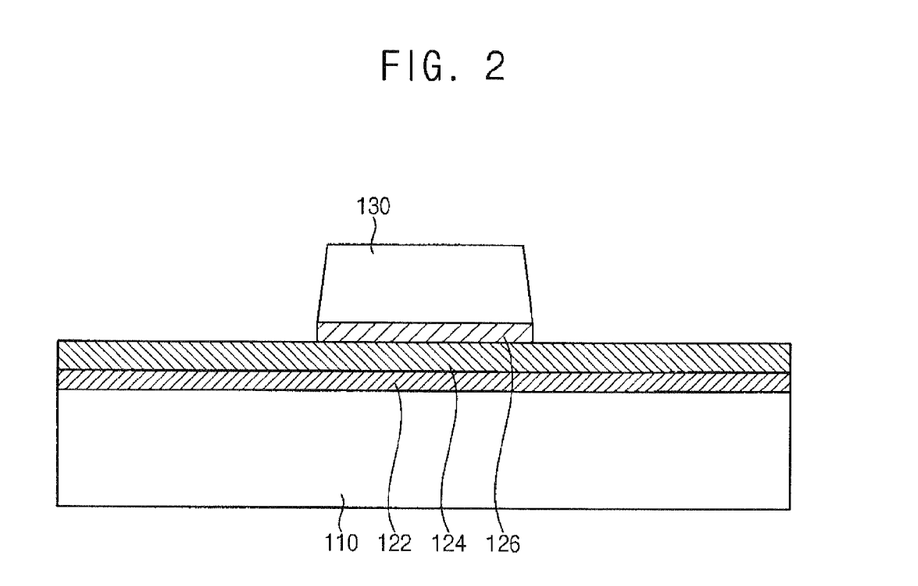
Figure 3:
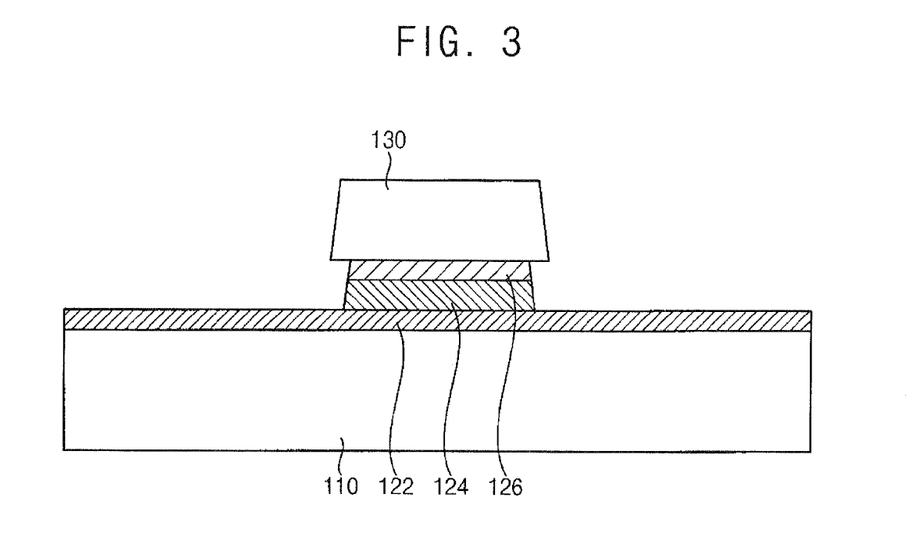
Figure 4:
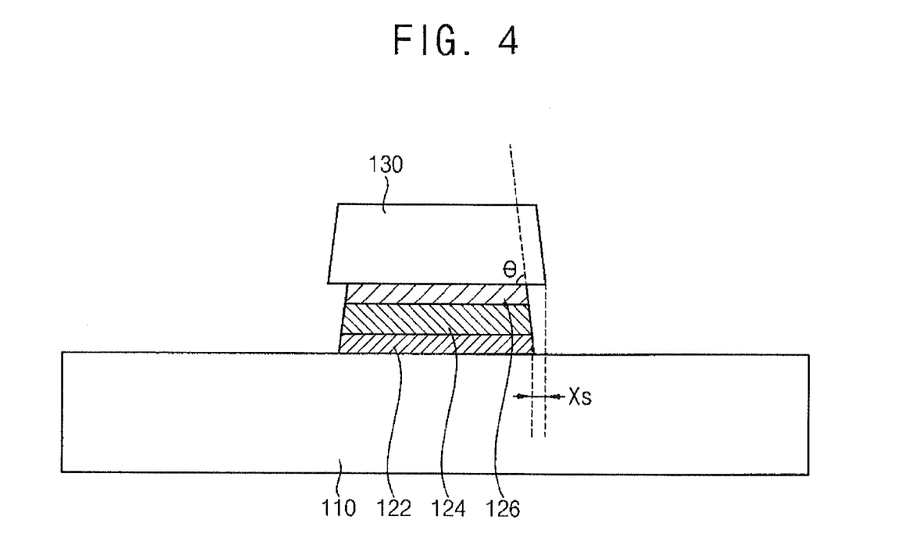

Referring to FIGS. 2 to 4, a photoresist pattern 130 is formed on the metal layer ML, and the metal layer ML is etched by using the photoresist pattern 130 as an etch-stop layer. The copper layer 124 and the copper-manganese alloy layer 126 in the metal layer ML may be etched by an etching composition including about 0.1% to about 30% by weight of ammonium persulfate (($NH_4$)$_2$$S_2$$O_8$,), about 0.1% to about 10% by weight of a sulfate, about 0.01% to about 5% by weight of an acetate, and about 55% to about 99.79% by weight of water. The copper layer 124 and the copper-manganese alloy layer 126 may be etched depending on the time during which etching by the etching composition proceeds. The etching composition etches a copper layer or a copper alloy layer, but may not etch metals, such as titanium of other layers. Thus, when the metal layer ML further includes the titanium layer 122, an additional etching composition may be used for etching the titanium layer 122.

As the copper layer 124 and the copper-manganese alloy layer 126 are etched, the titanium layer 122 is exposed. Thereafter, the titanium layer 122 can be etched to form a metal pattern MP illustrated in FIG. 4.

The photoresist pattern 130 may be formed from a positive photoresist composition. Alternatively, the photoresist pattern 130 may be formed from a negative photoresist composition.

The metal layer ML may be etched through a conventional method known in the art. For example, the etching composition for the copper layer 124 and the copper-manganese alloy layer 126 and the etching composition for the titanium layer 122 may be provided to the metal layer ML through a dipping process or a spraying process, etc. For example, an etching process for the metal layer ML may be performed at a temperature of from about 30° C. to about 33° C. for about 50 seconds to about 150 seconds.

Ammonium persulfate in the etching composition may function as an oxidizer mainly etching the copper layer 124 and the copper-manganese alloy layer 126. Ammonium persulfate having a high degree of purity, which may be used for manufacturing a semiconductor, may be used. Ammonium persulfate may etch the metal layer through a chemical reaction presented by Chemical Equation 1 to form a stable compound.

$S_2O_8^{2-}$+Cu+Mn→$CuSO_4$+$MnSO_4$     <Chemical Equation 1>

When the amount of ammonium persulfate is less than about 0.1% by weight based on a total weight of the etching composition, the etching composition may not etch the copper layer 124 and the copper-manganese alloy layer 126. When the amount of ammonium persulfate is greater than about 30% by weight, the etching composition may excessively etch at a fast rate which makes it difficult to control an etching time. Thus, in an embodiment of the invention, the amount of ammonium persulfate may be from about 0.1% by weight to about 30% by weight based on the total weight of the etching composition. In an embodiment, the amount of ammonium persulfate may be from about 5% by weight to about 15% by weight for stably etching the copper layer 124 and the copper-manganese alloy layer 126.

The sulfate controls an etching ratio of the etching composition to function as a sub-oxidizer etching the copper layer 124 and the copper-manganese alloy layer 126. The sulfate generates a sulfate ion ($SO_4^{2-}$) that may react with copper or manganese to effect the reaction of Chemical Equation 1. In an embodiment sulfate having a high degree of purity, which may be used for manufacturing a semiconductor.

Examples of the sulfate useful in the etching compositions in an embodiment of the present invention may include one or more of the following: ammonium sulfate, sodium sulfate, potassium sulfate, calcium sulfate, copper sulfate, magnesium sulfate, zinc sulfate, iron sulfate, aluminum sulfate, barium sulfate, etc. Theses may each be used alone or in a combination of two or more. In an embodiment of the present invention, ammonium sulfate, sodium sulfate or potassium sulfate may be used as the sulfate.

When an amount of the sulfate is less than about 0.1% by weight based on the total weight of the etching composition, it is difficult to control the etching ratio. When the amount of the sulfate is greater than about 10% by weight, the etching composition may excessively etch at a fast rate which may produce an undesirably small angle between an etching surface of copper-manganese alloy layer 126 and an upper surface of the base substrate 110 of from about 10° to about 15°, or may cause the pattern to be disconnected. Thus, in an embodiment, the amount of the sulfate may be in a range from about 0.1% by weight to about 10% by weight based on the total weight of the etching composition. In an embodiment, the amount of the sulfate may be in a range from about 0.5% by weight to about 5% by weight.

The acetate controls an etching ratio of the etching composition to function as a sub-oxidizer etching the copper layer 124 and the copper-manganese alloy layer 126 and to prevent a taper angle Θ of the metal pattern MP from being reduced. The taper angle may be defined as an acute angle formed between the upper surface of the base substrate 110 and a side surface of the metal patter MP. The etching composition including the acetate with ammonium persulfate and the acetate may control the taper angle to be from about 45° to about 75°.

The acetate may generate an acetate ion ($CH_3COO^-$). An acetate having a degree of purity, which may be used for manufacturing a semiconductor, may be used. Examples of the acetate of the etching composition may include one or more of ammonium acetate, sodium acetate, potassium acetate, calcium acetate, aluminum acetate, zinc acetate, tin acetate, magnesium acetate, and the like. Theses may each be used alone or in a combination of two or more thereof. In an embodiment, ammonium acetate, sodium acetate or potassium acetate may be used as the acetate of the etching composition.

In an embodiment the amount of the acetate in the etching composition is less than about 0.01% by weight based on the total weight of the etching composition, the etching composition may etch at an excessively fast rate which makes it difficult to control the etching time. In this embodiment, the taper angle θ may be less than about 15°. In an embodiment the amount of the acetate is greater than about 5% by weight, and the etching composition may not uniformly etch the copper layer 124 and the copper-manganese alloy layer 126. In this embodiment, the amount of the acetate may be in a range from about 0.01% by weight to about 5% by weight based on the total weight of the etching composition. In an embodiment, the amount of the acetate may be in a range from from about 0.1% by weight to about 3% by weight.

Water is added to the ammonium persulfate, the sulfate and the acetate such that the total weight of the etching composition is defined as 100%. In an embodiment, the amount of water may be in a range from about 55% by weight to about 99.79% by weight based on the total weight of the etching composition. Deionized water or water having a degree of purity, such as may be used for manufacturing a semiconductor, may be used.

Referring to FIG. 2, when the metal layer ML is etched by using the etching composition, the copper-manganese alloy layer 126 corresponding to an upper layer of the metal layer ML is firstly etched. A portion of the copper-manganese alloy layer 126, which is disposed under the photoresist pattern 130 and is not exposed to the etching composition, is not removed and the copper-manganese alloy layer 126 remains on the base substrate 110.

Referring to FIG. 3, while the metal layer ML is exposed to the etching composition, the copper layer 124 is etched. While the copper layer 124 is etched, the copper-manganese alloy layer 126 may be also etched by the etching composition because of the characteristics of the wet etching process as described above.

Referring to FIG. 4, as the copper layer 124 and the copper-manganese alloy layer 126 are etched, the titanium layer 122 is partially exposed, and the titanium layer 122 is etched by the etching composition for the titanium layer 122 to form the metal pattern MP. As a result, the metal pattern MP having a taper angle θ in a range from about 45° to about 75° may be formed. The metal pattern MP may be divided into a first pattern including the copper layer 124 and the copper-manganese alloy layer 126, and a second pattern including the titanium layer 122 disposed under the first pattern. The taper angle θ of the metal pattern MP may be substantially the same as a first angle between an etching surface of the first pattern and the upper surface of the base substrate 110. Furthermore, the taper angle θ of the metal pattern MP may be substantially the same as a second angle between an etching surface of the second pattern and the upper surface of the base substrate 110. Hereinafter, the first angle will be considered as the taper angle θ of the metal pattern MP.

The metal layer ML may be over-etched for a time longer than an etching end point to remove the metal layer ML on a region where the photoresist pattern 130 is not formed, which may be defined as a time required for removing the metal layer ML such that the upper surface of the base substrate 110 is exposed. When the metal layer ML is over-etched, a skew length Xs, which is a distance between an end of the metal pattern MP and an edge of the photoresist pattern 130, may be about 0 μm, i.e. the an end of the metal pattern MP is positioned perpendicularly under the edge of the photoresist pattern 130.

Hereinafter, the etching composition according to an example embodiment of the present invention will be explained in detail with reference to Examples 1 to 8 and Comparative Examples 1 to 4.

Preparing Examples 1 to 8 and Comparative Examples 1 to 4

Etching compositions according to Examples 1 to 8 and Comparative Examples 1 to 4 were prepared according to Table 1. In Table 1, amounts of components are represented by weight percent based on a total weight of an etching composition, and "APS" represents ammonium persulfate.

TABLE 1

| | | Sulfate | | | Acetate | | | |
|---|---|---|---|---|---|---|---|---|
| | APS | Ammonium sulfate | Potassium sulfate | Sodium sulfate | Ammonium acetate | Potassium acetate | Sodium acetate | Water |
| Example 1 | 10 | 5 | — | — | — | — | 1.2 | 83.8 |
| Example 2 | 10 | 5 | — | — | — | — | 0.7 | 84.3 |
| Example 3 | 10 | 5 | — | — | — | — | 1.4 | 83.6 |
| Example 4 | 15 | 0.7 | — | — | 0.4 | — | — | 83.9 |
| Example 5 | 15 | 0.7 | — | — | — | 0.4 | — | 83.9 |
| Example 6 | 15 | 0.7 | — | — | — | — | 0.4 | 83.9 |
| Example 7 | 15 | — | 0.7 | — | 0.4 | — | — | 83.9 |
| Example 8 | 15 | — | — | 0.7 | 0.4 | — | — | 83.9 |
| Comparative Example 1 | 10 | 11 | — | — | 0.4 | — | — | 78.6 |
| Comparative Example 2 | 15 | — | — | — | 0.5 | — | — | 84.5 |
| Comparative Example 3 | 15 | 0.5 | — | — | — | — | — | 84.5 |
| Comparative Example 4 | 10 | 0.5 | — | — | — | — | 1 | 88.5 |

Preparing Samples 1 to 8 and Comparative Samples 1 to 4

A titanium layer, a copper layer and a copper-manganese alloy layer were sequentially formed on a glass substrate through a chemical vapor deposition process. A atomic ratio of copper to manganese was about 50:50. The thickness of the titanium layer was about 100 Å to about 300 Å, and the thickness of the copper layer was about 1,000 Å to about 5,000 Å, and the thickness of the copper-manganese alloy layer was about 100 Å to about 300 Å. Thereafter, a photoresist layer was formed on the copper-manganese alloy layer, and then exposed to a light and developed to form a photoresist pattern. An etching composition of Example 1 having a temperature of about 30° C. was sprayed to the copper-manganese alloy layer through the photoresist pattern to etch the copper-manganese alloy layer and the copper layer. Accordingly, Sample 1 having a metal pattern was prepared. The copper-manganese alloy layer and the copper layer were over-etched by about 60% with respect to an etching end point. Particularly, the copper-manganese alloy layer and the copper layer were etched for about 130 seconds, which was about 1.6× the time required for the etching end point.

Samples 2 to 8 were prepared by using etching compositions of Examples 2 to 8 through a substantially same method as Sample 1, and Comparative Samples 1 to 4 were prepared by using etching compositions of Comparative Examples 1 to 4 through a substantially same method as Sample 1.

Evaluation of Etching Characteristics

Profiles of metal patterns and photoresist patterns of Samples 1 to 8 and Comparative Samples 1 to 4, which were prepared by using the etching compositions of Examples 1 to 8 and Comparative Examples 1 to 4, were observed by a scanning electron microscope S-4200 (trade name, Hitachi™). Thus obtained results are represented by following FIG. 5 and Table 2.

TABLE 2

|  | Skew length | Taper angle |
|---|---|---|
| Sample 1 | ⊙ | ⊙ |
| Sample 2 | ⊙ | ○ |
| Sample 3 | ⊙ | ⊙ |
| Sample 4 | ⊙ | ⊙ |
| Sample 5 | ⊙ | ○ |
| Sample 6 | ○ | ⊙ |
| Sample 7 | ○ | ⊙ |
| Sample 8 | ○ | ⊙ |
| Comparative Sample 1 | X | X |
| Comparative Sample 2 | ⊙ | ⊙ |
| Comparative Sample 3 | ⊙ | X |
| Comparative Sample 4 | X | X |

In Table 2, the skew length represents a distance between an edge of the metal pattern and an edge of the photoresist pattern. The symbol "⊙" indicates that the skew length is in a range from about 0.45 μm to about 0.75 μm, and "○" indicates that the skew length is in a range from about 0.15 μm to about 0.45 μm, and "X" indicates that the skew length is more than about 0.75 μm.

The symbol "⊙" indicates that the taper angle is in a range from about 50° to about 60°, and "○" indicates that the taper angle is in a range from about 40° to about 50°, and "X" indicates that the taper angle is less than about 40°.

Figure 5:
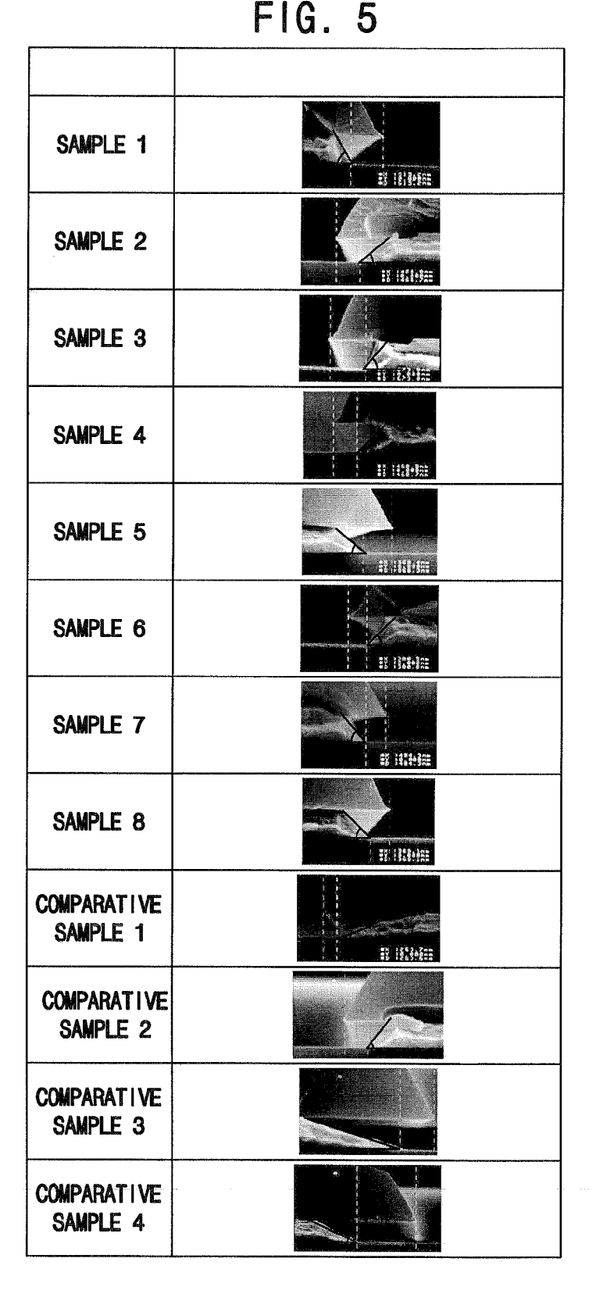
FIG. 5 is a table including scanning electron microscope (SEM) pictures showing the photoresist patterns and the metal patterns including the copper layers and the copper-manganese alloy layers, which were etched by the etching compositions of Examples 1 to 8 and Comparative Examples 1 to 4.

FIG. 5 is a table including scanning electron microscope (SEM) pictures showing the photoresist patterns and the metal patterns including the copper layers and the copper-manganese alloy layers, which were etched by the etching compositions of Examples 1 to 8 and Comparative Examples 1 to 4.

Referring to FIG. 5 and Table 2, the metal patterns etched by the etching compositions of Examples 1 to 8 form an acute angle of from about 40° to about 60° with respect to the upper surface of the glass substrate.

In contrast, the metal pattern etched by the etching composition of Comparative Example 1 forms an acute angle of about 30° with respect to the upper surface of the glass substrate. The metal pattern etched by the etching composition of Comparative Example 2 has an improved skew length and taper angle. However, the time required for etching the copper layer and the copper-manganese alloy layer by using the etching composition of Comparative Example 2 was more than about 100 seconds, which may increase the entire manufacturing time. Furthermore, the metal pattern etched by the etching composition of Comparative Example 3 has a low taper angle, and the metal pattern etched by the etching composition of Comparative Example 4 has a low taper angle and a long skew length.

Therefore, it can be noted that in an embodiment of the present invention, an etching composition including from about 0.1% to about 30% by weight of ammonium persulfate $((NH_4)_2S_2O_8,)$, about 0.1% to about 10% by weight of a sulfate, about 0.01% to about 5% by weight of an acetate, and about 55% to about 99.79% by weight of water may form a metal pattern including a copper layer and a copper-manganese alloy layer and having a taper angle of about 40° to about 60° with respect to an upper surface of a base substrate. Even when a titanium layer is patterned by using the metal pattern and the photoresist pattern, the entire taper angle of the metal pattern including the copper layer, the copper-manganese alloy layer and the titanium layer may be maintained to be from about 40° to about 60°.

Referring to Table 2, the metal patterns etched by the etching compositions of Examples 1 to 8 have better skew length with compared to the metal pattern etched by the etching compositions of Comparative Example 1.

Evaluation of Storing Stability

Sample 9 was prepared by using the etching composition of Example 1 having a temperature of about 25° C. by substantially the same method as for Sample 1. The etching end point, the skew length and the taper angle for Sample 9 were measured, and an SEM picture was also obtained. The results are shown in Table 3 and FIG. 6.

Samples 10, 11, 12, 13 and 14 were prepared by the using the etching composition of Example 1, which had been stored at about 25° C. for about 3 days, about 6 days, about 9 days, about 12 days and about 15 days respectively, by substantially the same method as for Sample 9. The etching end point, the skew length and the taper angle for Samples 10 to 14 were measured, and an SEM picture was also obtained. The obtained results are shown in Table 3 and FIG. 6.

TABLE 3

|  | Storing days | | | | | |
|---|---|---|---|---|---|---|
|  | 0 | 3 | 6 | 9 | 12 | 15 |
| Etching end point (seconds) | 87 | 88 | 86 | 87 | 85 | 92 |
| Skew length (μm) | 0.645 | 0.592 | 0.632 | 0.593 | 0.604 | 0.432 |
| Taper angle (°) | 53 | 54 | 55 | 54 | 53 | 56 |

In Table 3, the etching end point is defined as the time required for etching a metal pattern such that the copper layer and the copper-manganese alloy layer, that are not covered by a photoresist pattern, are entirely removed.

Figure 6:
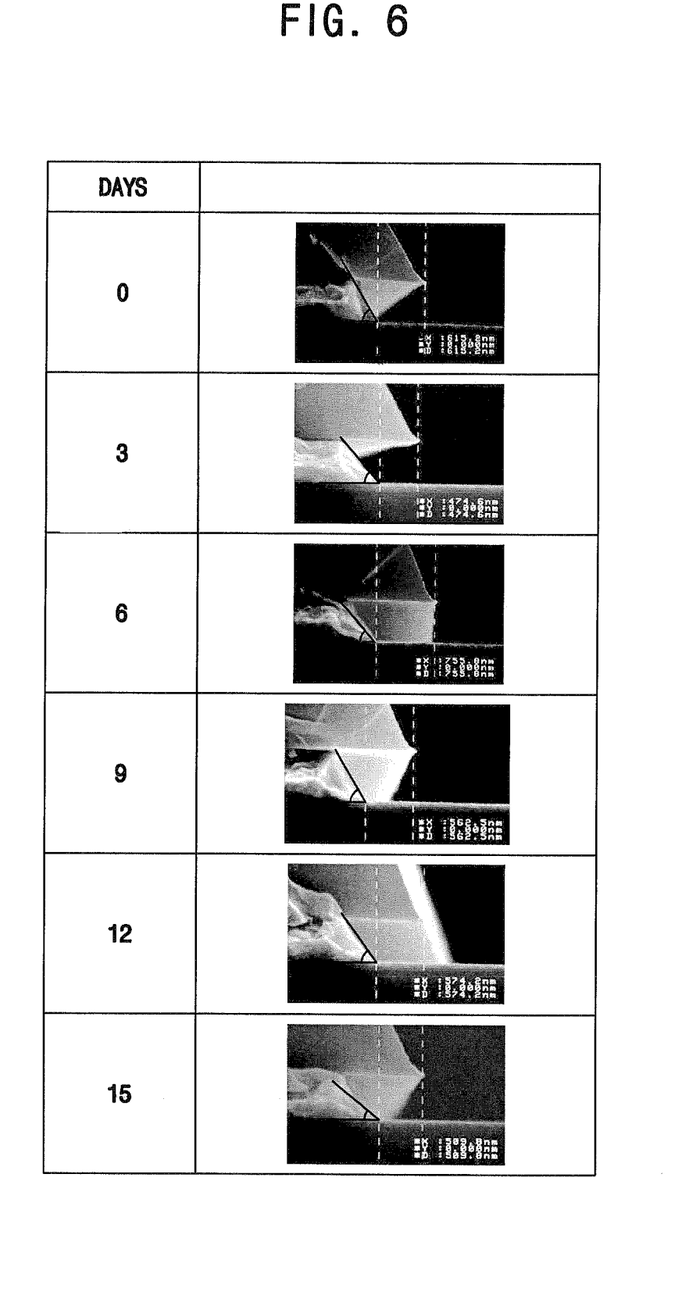
FIG. 6 is a table including SEM pictures showing the photoresist patterns and the metal patterns etched for evaluation of storing stability for the etching composition of Example 1.

FIG. 6 is a table including SEM pictures showing the photoresist patterns and the metal patterns etched for evaluation of storing stability for the etching composition of Example 1.

Referring to FIG. 6 and Table 3, even if the etching composition of Example 1 were stored at a room temperature for 12 days, no deterioration of the etching characteristics of the etching composition of Example 1 was detected. Thus, it can be noted that the etching composition of Example 1 may maintain initial etching characteristics at room temperature for a relatively long time, i.e. at least 12 days, or more.

Evaluation of Capacity

Copper powder was added to the etching composition of Example 1, and the copper powder was dissolved in the etching composition for about 3 hours such that a copper ion concentration in the etching composition was about 100 ppm. A metal layer including a titanium layer, a copper layer and a copper-manganese alloy layer was etched by using a photoresist pattern formed on the metal pattern as an etch-stop mask to form a metal pattern. The thickness of the titanium layer was from about 100 Å to about 300 Å, and the thickness of the copper layer was from about 1,000 Å to about 5,000 Å, and the thickness of the copper-manganese alloy layer was from about 100 Å to about 300 Å. A profile of the metal pattern was analyzed by a field emission scanning electron microscope (FE-SEM).

Copper powder was further added to the etching composition having about 100 ppm of copper ion, and the copper powder was dissolved in the etching composition for additional 3 hours such that a copper ion concentration in the etching composition was about 200 ppm. In similar methods to the above, etching compositions having about 300 ppm and about 400 ppm of copper ion concentration were prepared. The results obtained are shown in the following Table 4 and FIG. 7.

TABLE 4

| | Copper powder (dissolution time) | | | | |
|---|---|---|---|---|---|
| | 0 ppm (0 hour) | 100 ppm (3 hour) | 200 ppm (6 hour) | 300 ppm (9 hour) | 400 ppm (12 hour) |
| Etching end point (seconds) | 87 | 86 | 84 | 84 | 81 |
| Skew length (μm) | 0.698 | 0.691 | 0.721 | 0.715 | 0.943 |
| Taper angle (°) | 58 | 57 | 55 | 55 | 39 |

Figure 7:
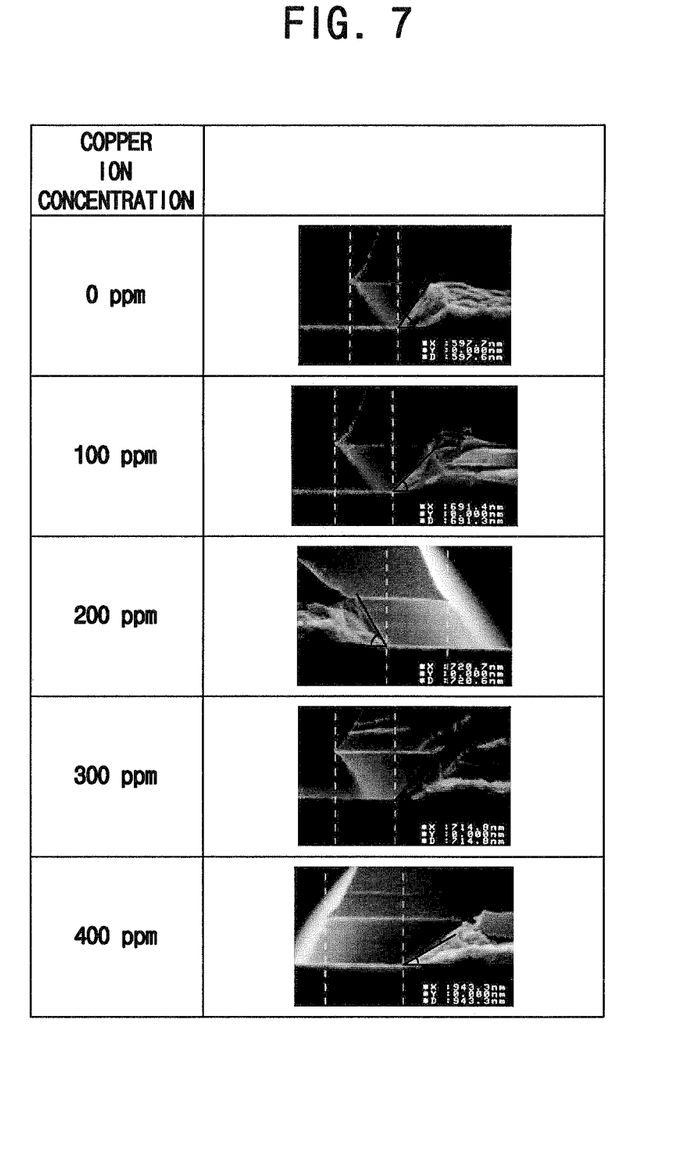
FIG. 7 is a table including SEM pictures showing the photoresist patterns and the metal patterns etched for evaluation of capacity for the etching composition of Example 1.

FIG. 7 is a table including SEM pictures showing the photoresist patterns and the metal patterns etched for evaluation of capacity for the etching composition of Example 1.

Referring to Table 4 and FIG. 7, etching characteristics of the etching composition of Example 1 was substantially maintained even when the etching composition of Example 1 included about 300 ppm of copper ion. Thus, it can be noted that the etching composition of Example 1 may maintain initial etching characteristics when used for etching a variety of substrates including for instance, a titanium layer, a copper layer and a copper-manganese alloy layer.

Figure 8:
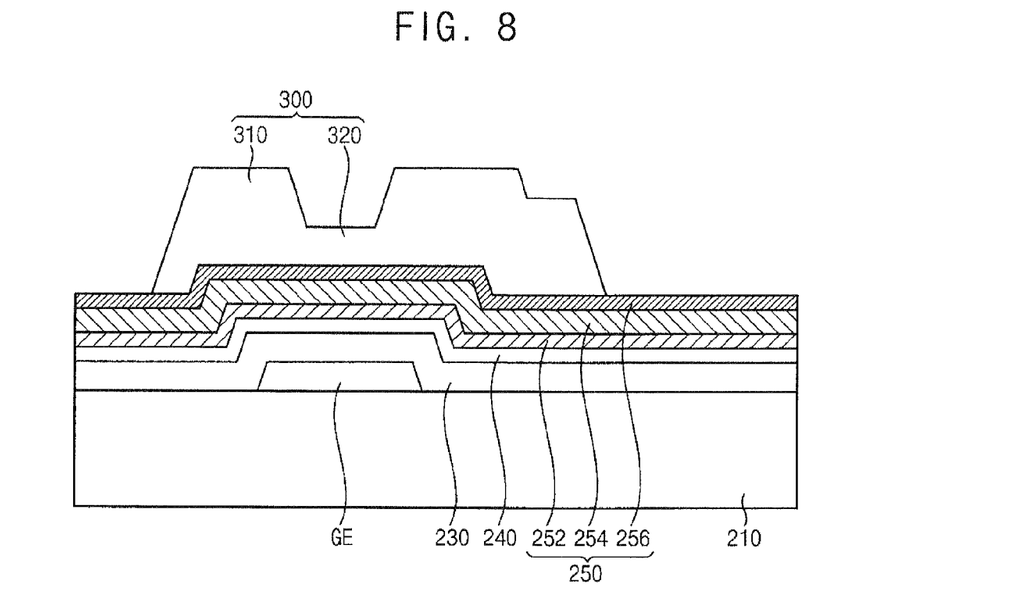
FIGS. 8 to 10 are cross-sectional views illustrating a method of manufacturing a display substrate according to an example embodiment of the present invention.
Figure 9:
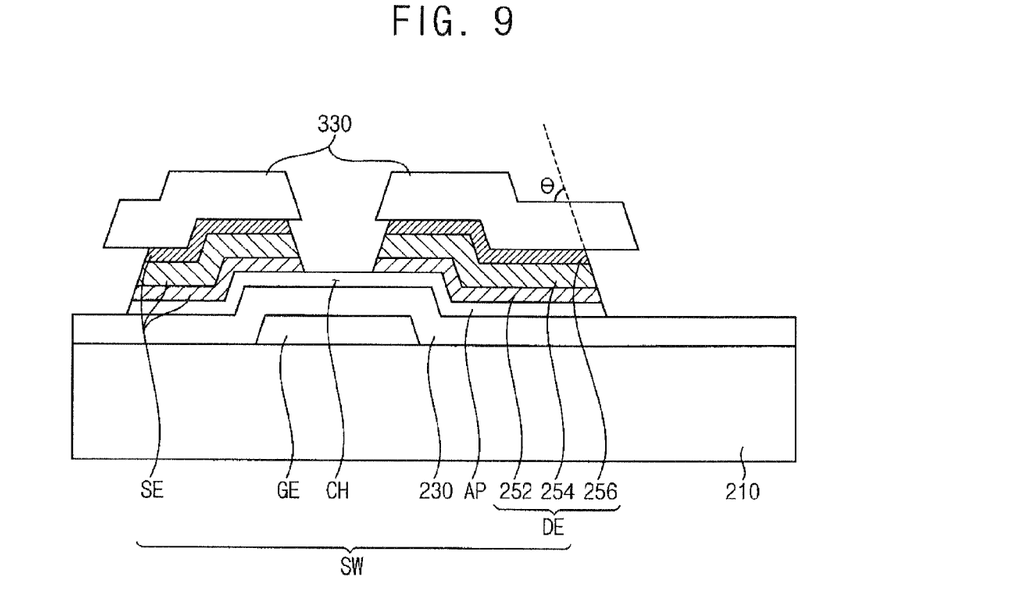
Figure 10:
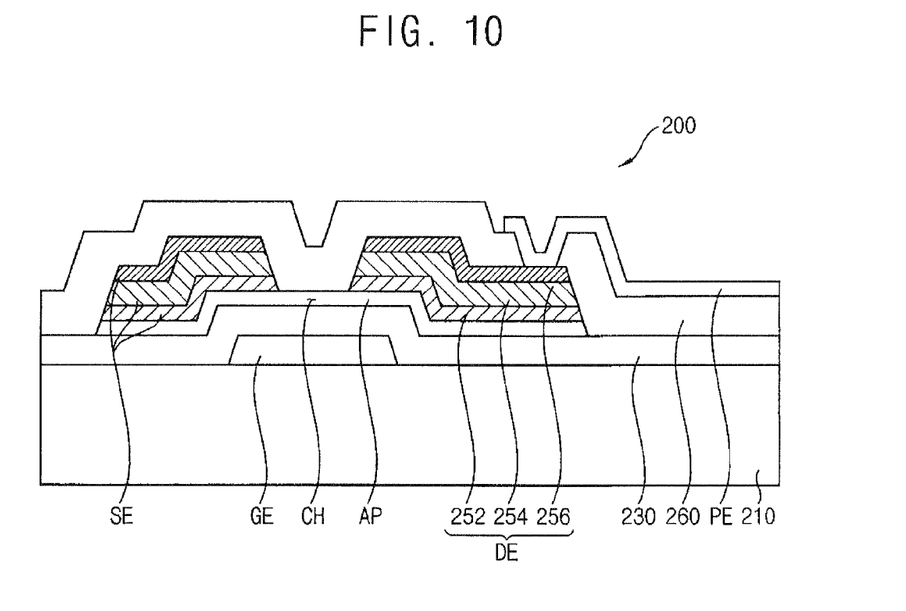

FIGS. 8 to 10 are cross-sectional views illustrating a method of manufacturing a display substrate according to an example embodiment of the present invention.

Referring to FIG. 8, a gate electrode GE is formed on a base substrate 210, an insulation layer 230, a semiconductor layer 240 and a data metal layer 250 are sequentially formed on the base substrate 210 having the gate electrode GE.

The gate electrode GE may have a single-layered structure or a multiple-layered structure including at least two metal layers. The gate electrode GE is connected to a gate line extending in a direction on the base substrate 210.

The insulation layer 230 covers the base substrate 210 having the gate line and the gate electrode GE. The insulation layer 230 may include silicon oxide so that the semiconductor layer 240 may not be damaged.

The semiconductor layer 240 is formed on the base substrate 210 having the insulation layer 230, and includes a metal oxide having higher electron mobility than amorphous silicon. The metal oxide functions as an oxide semiconductor, and may include a single metal source or at least two metals that are different from each other.

The data metal layer 250 includes a titanium layer 252, a copper layer 254 and a copper-manganese alloy layer 256, which are sequentially formed on the semiconductor layer 240. The thickness of the titanium layer may be from about 100 Å to about 300 Å, and the thickness of the copper layer may be from about 1,000 Å to about 5,000 Å, and the thickness of the copper-manganese alloy layer may be from about 100 Å to about 300 Å.

A photoresist pattern 300 is formed on the data metal layer 250. For example, a negative type photoresist composition may be coated, exposed to a light and developed to form the photoresist pattern 300. The photoresist pattern 300 has a first portion 310 having a first thickness, a second portion 320 having a second thickness less than the first thickness. The first portion 310 is disposed on a region where the data metal layer 250 remains, and the photoresist pattern 300 is not formed on a region where the data metal layer 250 is removed. The second portion 320 is disposed on a region where a channel portion of a thin film transistor SW is formed.

The data metal layer 250 is firstly etched by using the photoresist pattern 300 as an etch-stop layer and using a first etching composition to form an electrode pattern remaining under the photoresist pattern 300 and to form a data line crossing the gate line and connected to the electrode pattern. The first etching composition may be a peroxide-based etchant including peroxide or a non-peroxide-based etchant including ammonium pursulfate. After the copper layer 254 and the copper-manganese alloy layer 256 are etched by a copper etching composition, the titanium layer 252 may be etched by an etching composition different from the copper etching composition. Alternatively, the titanium layer 252, the copper layer 254 and the copper-manganese alloy layer 256 may be etched together by the same etching composition.

The semiconductor layer 240 is etched by using the photoresist pattern 330 and the electrode pattern as an etch-stop layer to form an active pattern AP. A dummy pattern formed from the semiconductor layer 240 may be formed under the data line.

Referring to FIG. 9, the second portion corresponding to 320 in FIG. 8 is removed from the base substrate 210 having the data line and the electrode pattern to form a remaining photoresist pattern 330. The thickness of the photoresist pattern 300 is reduced by the second thickness of the second portion 320 to form the remaining photoresist pattern 330. The electrode pattern is exposed in a region where the remaining photoresist pattern 330 is not formed.

Thereafter, the electrode pattern is etched by using the remaining photoresist pattern 330 as an etch-stop layer and by using a second etching composition to form a source electrode SE and a drain electrode DE of the thin film transistor SE. The source electrode SE is connected to the data line, and a portion of the electrode pattern is removed so that the source electrode SE is spaced apart from the drain electrode DE. The active pattern AP is partially exposed through a gap between the source electrode SE and the drain electrode DE. A portion of the active pattern AP, which is exposed through the gap between the source electrode SE and the drain electrode DE, corresponds to a channel CH of the thin film transistor SW.

The second etching composition includes from about 0.1% to about 30% by weight of ammonium persulfate (($NH_4$)$_2S_2O_8$,), from about 0.1% to about 10% by weight of a sulfate, from about 0.01% to about 5% by weight of an acetate, and from about 55% to about 99.79% by weight of water. In an embodiment of the invention, the second etching composition may include from about 5% to about 15% by weight of ammonium persulfate, from about 0.5% to about 5% by weight of a sulfate, from about 0.1% to about 3% by weight of an acetate, and from about 77% to about 94.4% by weight of water. The second etching composition is substantially the same as the previously explained etching composition according to an example embodiment of the present invention. Therefore, any duplicated explanation will be omitted. The first etching composition may be substantially the same as the second etching composition. The second etching composition may stably remove the copper-manganese alloy layer 256 and the copper layer 254.

Furthermore, the data metal layer 250 may be over-etched longer than an etching end point so that the data metal layer 250 remaining on a region excluding a region, where the remaining photoresist pattern 330 is formed, may be minimized. According to an example embodiment of the present invention, the taper angle of the source electrode SE and the drain electrode DE formed by using the second etching composition may be maintained in a range of from about 40° to about 60° even if the data metal layer 250 is over-etched.

Thereafter, the titanium layer 252 of the electrode pattern is removed to form the channel CH. Thereafter, the remaining photoresist pattern 330 can be removed.

Referring to FIG. 10, a passivation layer 260 is formed on the base substrate 110 having the data line, the source electrode SE and the drain electrode DE. In an embodiment, the passivation layer 260 may include silicon oxide. The copper-manganese alloy layer 256 prevents contact between the passivation layer 250 and the copper layer 254, so that damage to the copper layer 254 is prevented. Furthermore, since the passivation layer 260 includes silicon oxide, damage to the semiconductor layer 240 where the active pattern AP contacts the passivation layer 260 may be prevented.

Thereafter, a hole is formed through the passivation layer 260 to expose the drain electrode DE, and a pixel electrode PE is formed on the passivation layer 260 having the hole. The pixel electrode PE contacts the drain electrode DE to be electrically connected to the thin film transistor SE.

Accordingly, a display substrate 200 including an oxide semiconductor thin film transistor may be prepared.

Even though not illustrated, an ohmic contact layer may be formed in addition on the semiconductor layer 240 to reduce an ohmic resistance between the semiconductor layer 240 and the source and drain electrodes SE and DE. For example, an additional metal layer formed under the titanium layer 252 may function as the ohmic contact layer. Alternatively, the titanium layer 252 of the data metal layer 250 may function as the ohmic contact layer.

Furthermore, when the gate metal layer forming the gate electrode GE has a multiple-layered structure having a copper layer and a copper-manganese alloy layer formed on the copper layer, the gate metal layer may be etched by an etching composition substantially the same as the second etching composition for etching the data metal layer 250. Thus, even if the gate metal layer is over-etched, a taper angle of the gate electrode GE may be stably maintained.

According to an example embodiment of the present invention, the etching composition is used for etching the data metal layer 250 so that the source electrode SE, the drain electrode DE and the data line have a stable profile. Particularly, since the source electrode SE, the drain electrode DE and the data line has a taper angle of from about 40° to about 60°, disconnection of the passivation layer 260 or the pixel electrode PE due to an overetched step structure may be prevented. Thus, the manufacturing reliability of the display substrate 200 may be improved.

According to an example embodiment of the present invention, when a display substrate has a thin film transistor of a top-gate structure, which includes a gate electrode formed on an oxide semiconductor pattern, a source electrode and a drain electrode, the etching composition may be used for etching a data metal layer so that disconnection of the gate electrode or a pixel electrode due to a step structure may be prevented. The thin film transistor of the top-gate structure may be formed on a glass substrate, and may include an oxide semiconductor pattern, source/drain electrodes formed on the oxide semiconductor pattern, and a gate electrode overlapped with the source/drain electrodes. The oxide semiconductor pattern and the source/drain electrodes may be formed by using a single photoresist pattern and by using an etching composition substantially the same as the second etching composition, as illustrated in FIG. 9.

According to the example embodiments of the present invention, an etching composition has an improved storing stability, and improves manufacturing margin. Thus, the etching composition may form a metal pattern having a profile of a stable tapered shape, even if the metal pattern includes a copper-manganese alloy layer. Furthermore, the etching composition may be stored without deterioration of its etching characteristics. Thus, manufacturing reliability and productivity for a display substrate may be improved.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings of the present invention. Accordingly, all such modifications are intended to be included within the scope of the present invention as defined in the claims.

What is claimed is:

1. A method of forming a metal pattern, the method comprising:
    forming a metal layer including a copper-manganese alloy layer on a base substrate;
    forming a photoresist pattern on the metal layer; and
    etching the metal layer by using an etching composition including from about 0.1% to about 30% by weight of ammonium persulfate, from about 0.1% to about 10% by weight of a sulfate, from about 0.01% to about 5% by weight of an acetate and from about 55% to about 99.79% by weight of water.

2. The method of claim 1, wherein the sulfate comprises at least one sulfate selected from the group consisting of ammonium sulfate, sodium sulfate, potassium sulfate, calcium sulfate, copper sulfate, magnesium sulfate, zinc sulfate, iron sulfate, aluminum sulfate and barium sulfate.

3. The method of claim 1, wherein the acetate comprises at least one acetate selected from the group consisting of ammonium acetate, sodium acetate, potassium acetate, calcium acetate, aluminum acetate, zinc acetate, tin acetate and magnesium acetate.

4. The method of claim 1, wherein the metal layer further includes a copper layer formed under the copper-manganese alloy layer.

5. A method of manufacturing a display substrate, the method comprising: forming a first metal layer on a base substrate;
    etching the first metal layer by using a photoresist pattern formed on the first metal layer as an etch-stop layer and by using an etching composition including from about 0.1% to about 30% by weight of ammonium persulfate, from about 0.1% to about 10% by weight of a sulfate, from about 0.01% to about 5% by weight of an acetate and from about 55% to about 99.79% by weight of water form a first signal line, a source electrode connected to the first signal line and a drain electrode spaced apart from the source electrode; and
    forming a pixel electrode contacting the drain electrode.

6. The method of claim 5, wherein the sulfate comprises at least one sulfate selected from the group consisting of ammonium sulfate, sodium sulfate, potassium sulfate, calcium sulfate, copper sulfate, magnesium sulfate, zinc sulfate, iron sulfate, aluminum sulfate and barium sulfate.

7. The method of claim 5, wherein the acetate comprises at least one acetate selected from the group consisting of ammonium acetate, sodium acetate, potassium acetate, calcium acetate, aluminum acetate, zinc acetate, tin acetate and magnesium acetate.

8. The method of claim 5, wherein the first metal layer includes a copper-manganese alloy layer.

9. The method of claim 5, further comprising:
forming a semiconductor layer under the first metal layer, and
wherein etching the first metal layer comprises:
etching the first metal layer by using the photoresist pattern, which has a first portion and a second portion thinner than the first portion, as an etch-stop layer to form the first signal line and an electrode pattern connected to the first signal line;
patterning the semiconductor layer by using the photoresist pattern and the electrode pattern as an etch-stop layer to form an active pattern; and
patterning the electrode pattern by using an remaining photoresist pattern formed by removing the second portion to expose the active pattern through a gap between the source electrode and the drain electrode.

10. The method of claim 5, further comprising:
patterning a second metal layer including a copper-containing metal layer by using an etching composition substantially same as the etching composition used for etching the first metal layer to form a second signal line crossing the first signal line, and a gate electrode connected to the second signal line.

11. The method of claim 8, further comprising:
forming a passivation layer on the base substrate having the drain electrode, the passivation layer covering the first signal line, the source electrode and the drain electrode, and including silicon oxide.

12. The method of claim 8, wherein the first metal layer further includes a copper layer formed under the copper-manganese alloy layer.

13. The method of claim 12, wherein the first metal layer further includes a titanium layer formed under the copper layer, and the copper layer and the copper-manganese alloy layer are etched by the etching composition, and the titanium layer is etched by a titanium etching composition.

14. The method of claim 13, further comprising:
forming an insulation layer under the titanium layer, the insulation layer including silicon oxide.

15. The method of claim 9, further comprising:
forming a passivation layer on the base substrate having the drain electrode, the passivation layer covering the first signal line, the source electrode and the drain electrode, and including silicon oxide, and
wherein the semiconductor layer includes a metal oxide.

* * * * *